(12) United States Patent
Gelfand et al.

(10) Patent No.: US 8,575,976 B2
(45) Date of Patent: Nov. 5, 2013

(54) FREQUENCY DIVIDER SYSTEMS AND METHODS THEREOF

(75) Inventors: Vadim Gelfand, Ramat Gan (IL); Aharon El-Bahar, Shoham (IL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 200 days.

(21) Appl. No.: 12/882,729

(22) Filed: Sep. 15, 2010

(65) Prior Publication Data

US 2011/0121869 A1 May 26, 2011

Related U.S. Application Data

(60) Provisional application No. 61/272,946, filed on Nov. 23, 2009.

(51) Int. Cl.
*H03B 19/00* (2006.01)
(52) U.S. Cl.
USPC ............ 327/117; 327/115; 327/149; 327/156
(58) Field of Classification Search
USPC .............. 327/141, 144–163; 331/1 A, 15–17; 375/373–376
See application file for complete search history.

(56) References Cited

U.S. PATENT DOCUMENTS

| | | | | |
|---|---|---|---|---|
| 5,436,938 A | * | 7/1995 | Pigeon | 375/376 |
| 6,100,767 A | * | 8/2000 | Sumi | 331/11 |
| 6,441,667 B1 | * | 8/2002 | Boerstler et al. | 327/295 |
| 6,456,164 B1 | * | 9/2002 | Fan | 331/16 |
| 7,365,607 B2 | | 4/2008 | Fahim | |
| 7,479,815 B1 | * | 1/2009 | Groe et al. | 327/156 |
| 7,912,167 B2 | * | 3/2011 | Saeki | 375/355 |
| 2003/0086517 A1 | * | 5/2003 | Vallet et al. | 375/355 |
| 2008/0048791 A1 | | 2/2008 | Fahim | |
| 2008/0191749 A1 | | 8/2008 | Haimzon | |
| 2009/0153205 A1 | * | 6/2009 | Johnson | 327/158 |

* cited by examiner

*Primary Examiner* — Lincoln Donovan
*Assistant Examiner* — Brandon S Cole
(74) *Attorney, Agent, or Firm* — Harness, Dickey & Pierce, P.L.C.

(57) ABSTRACT

At least one example embodiment provides for a frequency divider system including a delay unit configured to receive a first input clock signal having a first input clock frequency and a requirement and output a modified clock signal, and a frequency divider configured to receive the modified clock signal and output an output clock signal having an output clock frequency. The output clock frequency is an odd or even integer division of the first input clock frequency based on the requirement such as an input control word.

4 Claims, 15 Drawing Sheets

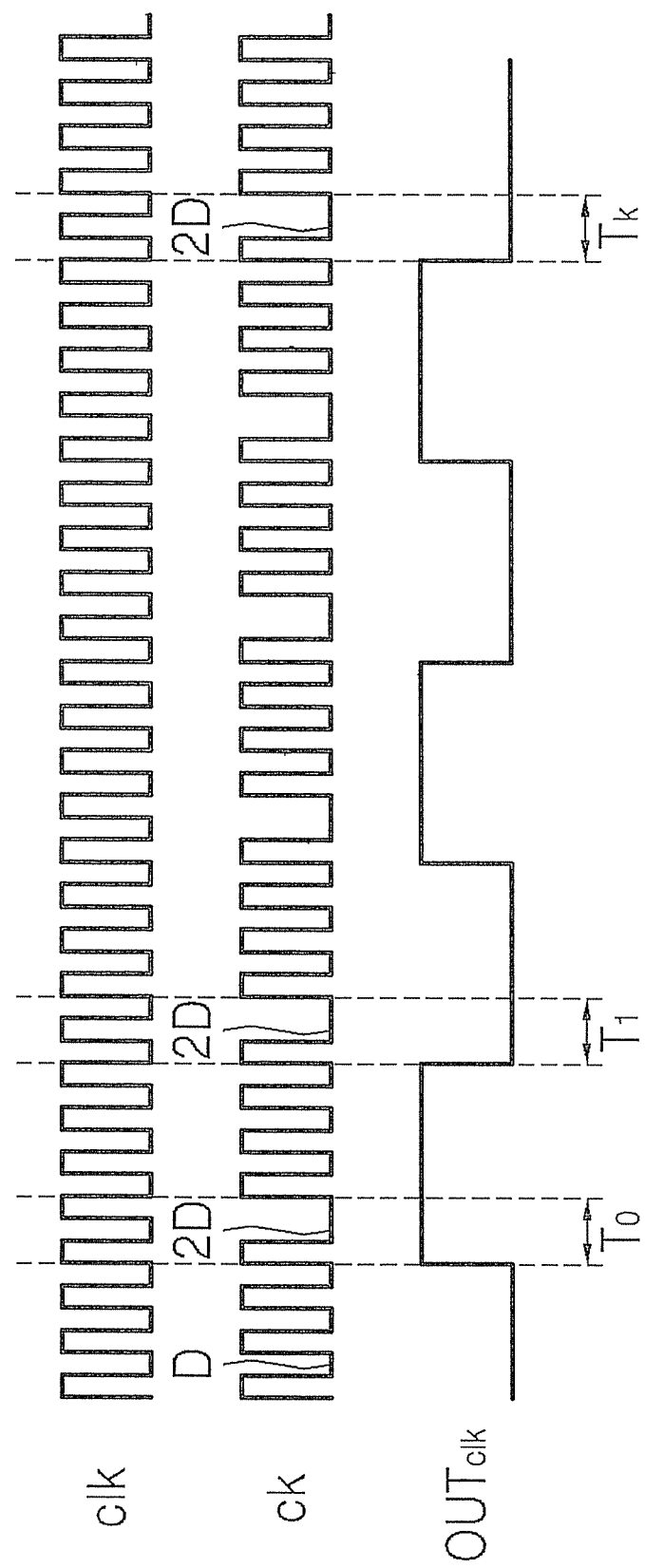

US 8,575,976 B2

FREQUENCY DIVIDER SYSTEMS AND METHODS THEREOF

PRIORITY STATEMENT

This application claims the benefit of U.S. Provisional Application No. 61/272,946, filed on Nov. 23, 2009.

BACKGROUND

In modern electronic systems, a frequency synthesizer is often used to generate high frequency outputs from a fixed low frequency input. The performance of the frequency synthesizer is usually limited by a frequency divider and a voltage-controlled oscillator (VCO) included in the frequency synthesizer.

Programmable frequency dividers by even factors (e.g., 2*N) are often used to generate high frequency outputs from the fixed low frequency input.

FIG. 1 illustrates a conventional frequency divider system. As shown, a frequency divider system 100 includes a periodic counter 110 and a frequency divider 120.

A duty cycle of a short pulse SP that is output from the periodic counter 110 is, in general, not close to 50% and, therefore, cannot be used in most applications.

In order to solve this issue, the frequency divider 120 is generally a frequency divider by two. The frequency divider by two 120 changes its output with every pulse from the periodic counter 110, which is described below. The frequency divider by two 120 is often implemented with a single flip-flop.

The periodic counter 110 receives division factor control bits div_by <m:0> and an input clock signal clk. The periodic counter 110 is configured to output a short pulse SP after every N input clock periods. The frequency divider by two 120 is configured to receive the short pulse SP and output a 50% duty cycle output. Due to the use of the frequency divider by two 120, a total division factor is limited to even factors (2*N) only.

FIG. 2 illustrates a timing diagram for the frequency divider system 100. As illustrated, a short pulse SP is output for every N (four is used only as an example) rising edge of the clock signal clk. For every rising edge of the short pulse SP, the output signal changes from a low level to a high level or vice versa.

Conventionally, a counting frequency is doubled to achieve a frequency divider by an odd division factor. Unfortunately, maximum counting frequency is limited by technology used and, in some cases, cannot be doubled. Additionally, even when counting frequency can be doubled, it leads to excessive power and, in some cases, also area penalties.

Frequency dividers may be implemented in many different electronic systems.

SUMMARY

Example embodiments are directed to conversion of a frequency divider system. Example embodiments disclose converting a frequency divider by an even factor, into a frequency divider by either an odd or any integer factor, thereby gaining more flexibility without significant power or area penalties. Frequency divider systems according to example embodiments conserve a 50% output duty cycle attribute of the original frequency divider. Moreover, frequency divider systems according to example embodiments conserve a maximum input clock frequency of the frequency divider.

At least one example embodiment provides for a frequency divider system including a delay unit configured to receive a first input clock signal having a first input clock frequency and output a modified clock signal, and a frequency divider configured to receive the modified clock signal and output an output clock signal having an output clock frequency. The output clock frequency is an odd division of the first input clock frequency based on the modified clock signal.

At least another example embodiment discloses a method of generating an output clock signal. The method includes first generating a first input clock signal having a first input clock frequency, second generating a modified clock signal based on the first input clock signal, the modified clock signal having a delay if the output clock signal changes from a first state to a second state or from the second state to the first state, and third generating the output clock signal having a frequency that is an odd division of the first input clock frequency.

BRIEF DESCRIPTION OF THE DRAWINGS

Example embodiments will be more clearly understood from the following detailed description taken in conjunction with the accompanying drawings. FIGS. 1-13 represent non-limiting, example embodiments as described herein.

FIG. 1 illustrates a conventional frequency divider system;

FIG. 2 illustrates a timing diagram of the conventional frequency divider system shown in FIG. 1;

FIG. 3 illustrates an odd integer factor frequency divider system according to an example embodiment;

FIG. 4 illustrates a timing diagram of the frequency divider system illustrated in FIG. 3;

FIG. 6 illustrates a timing diagram of the delay unit according to an example embodiment;

FIG. 7 illustrates an any integer factor frequency divider system according to another example embodiment;

FIG. 8 illustrates a method of generating an output clock signal according to an example embodiment;

FIG. 9 illustrates an image sensor including a frequency divider system according to example embodiments;

FIG. 10 illustrates a system including a frequency divider according to example embodiments;

FIG. 11 illustrates a complementary-metal-oxide-semiconductor (CMOS) image sensor;

FIG. 13 illustrates an electronic system according to an example embodiment.

DETAILED DESCRIPTION

Figure 1:
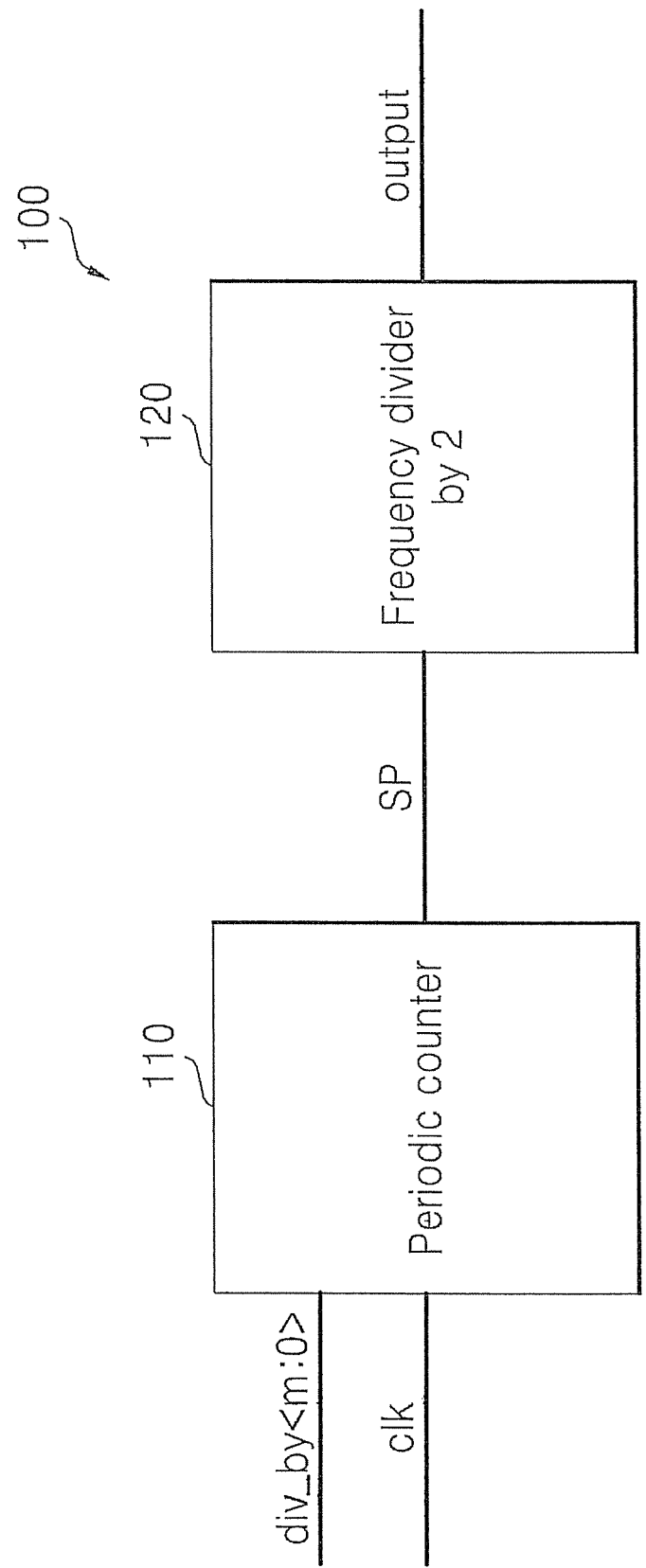
Figure 2:
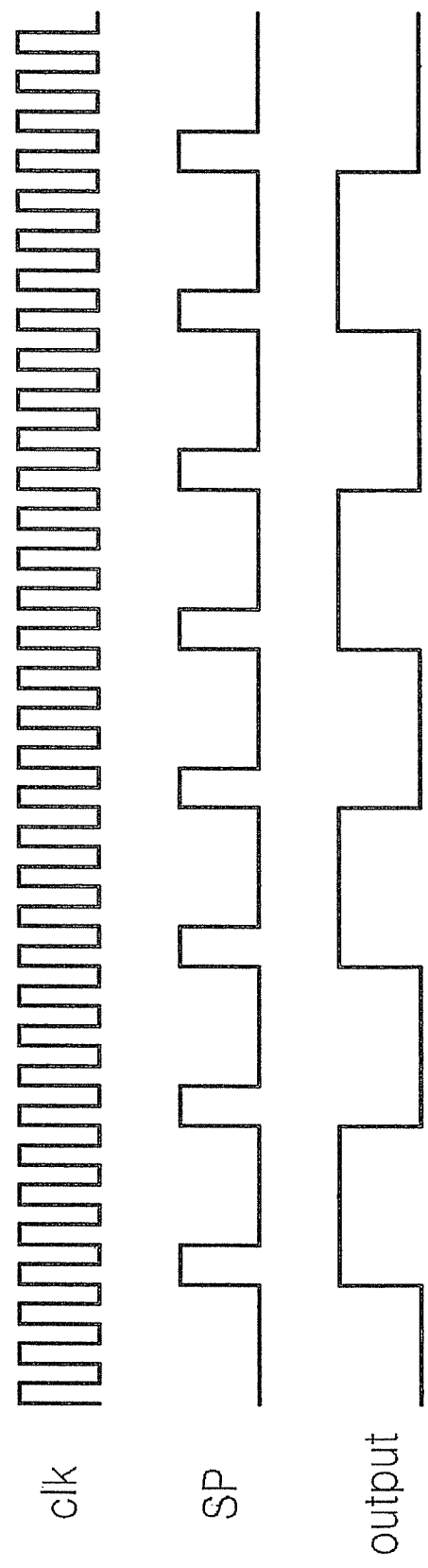

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural fog as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 11:
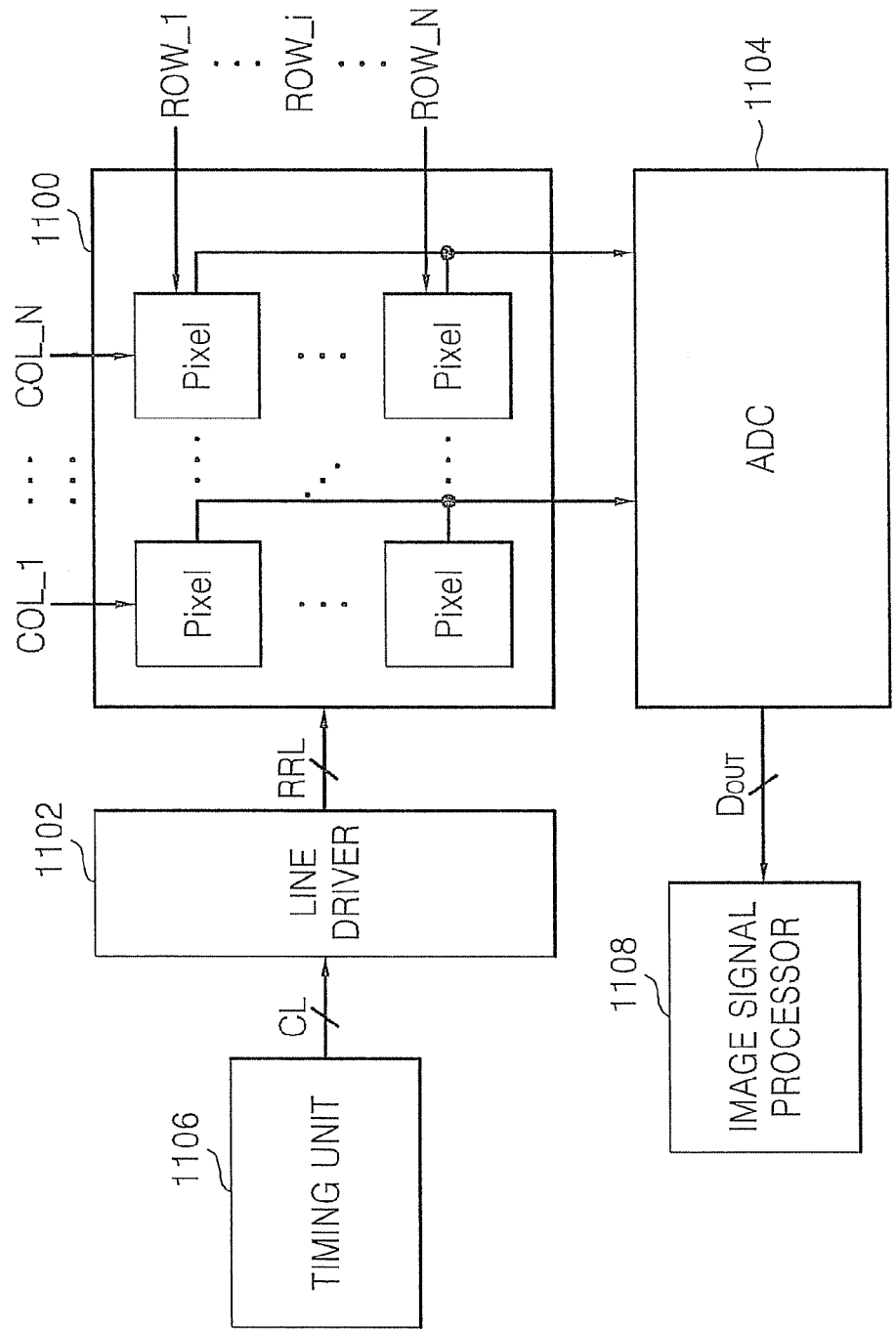

FIG. 11 illustrates an architecture for a complementary-metal-oxide-semiconductor (CMOS) image sensor.

Referring to FIG. 11, a timing unit or circuit 1106 controls a line driver 1102 through one or more control lines CL. In one example, the timing unit 1106 causes the line driver 1102 to generate a plurality of read and reset pulses. The line driver 1102 outputs the plurality of read and reset pulses to a pixel array 1100 on a plurality of read and reset lines RRL.

The pixel array 1100 includes a plurality of pixels P arranged in an array of rows ROW_1-ROW_N and columns COL_1-COL_N. Each of the plurality of read and reset lines RRL corresponds to a row of pixels P in the pixel array 1100. In FIG. 11, each pixel P may be an active-pixel sensor (APS), and the pixel array 1100 may be an APS array.

In more detail with reference to example operation of the image sensor in FIG. 11, read and reset pulses for an ith row ROW_i (where i={1, . . . , N}) of the pixel array 1100 are output from the line driver 1102 to the pixel array 1100 via an ith of the read and reset lines RRL. In one example, the line driver 1102 applies a reset signal to the ith row ROW_i of the pixel array 1100 to begin an exposure period. After a given, desired or predetermined exposure time, the line driver 1102 applies a read signal to the same ith row ROW_i of the pixel array to end the exposure period. The application of the read signal also initiates reading out of pixel information (e.g., exposure data) from the pixels P in the ith row ROW_i.

The analog to digital converter (ADC) 1104 converts the output voltages from the ith row of readout pixels into a digital signal (or digital data). The ADC 1104 may perform this conversion either serially or in parallel. An ADC 1104 having a column parallel-architecture converts the output voltages into a digital signal in parallel. The ADC 1104 then outputs the digital data (or digital code) DOUT to a next stage processor such as an image signal processor (ISP) 1108, which processes the digital data to generate an image. In one example, the ISP 1108 may also perform image processing operations on the digital data including, for example, gamma correction, auto white balancing, application of a color correction matrix (CCM), and handling chromatic aberrations.

Figure 12A:
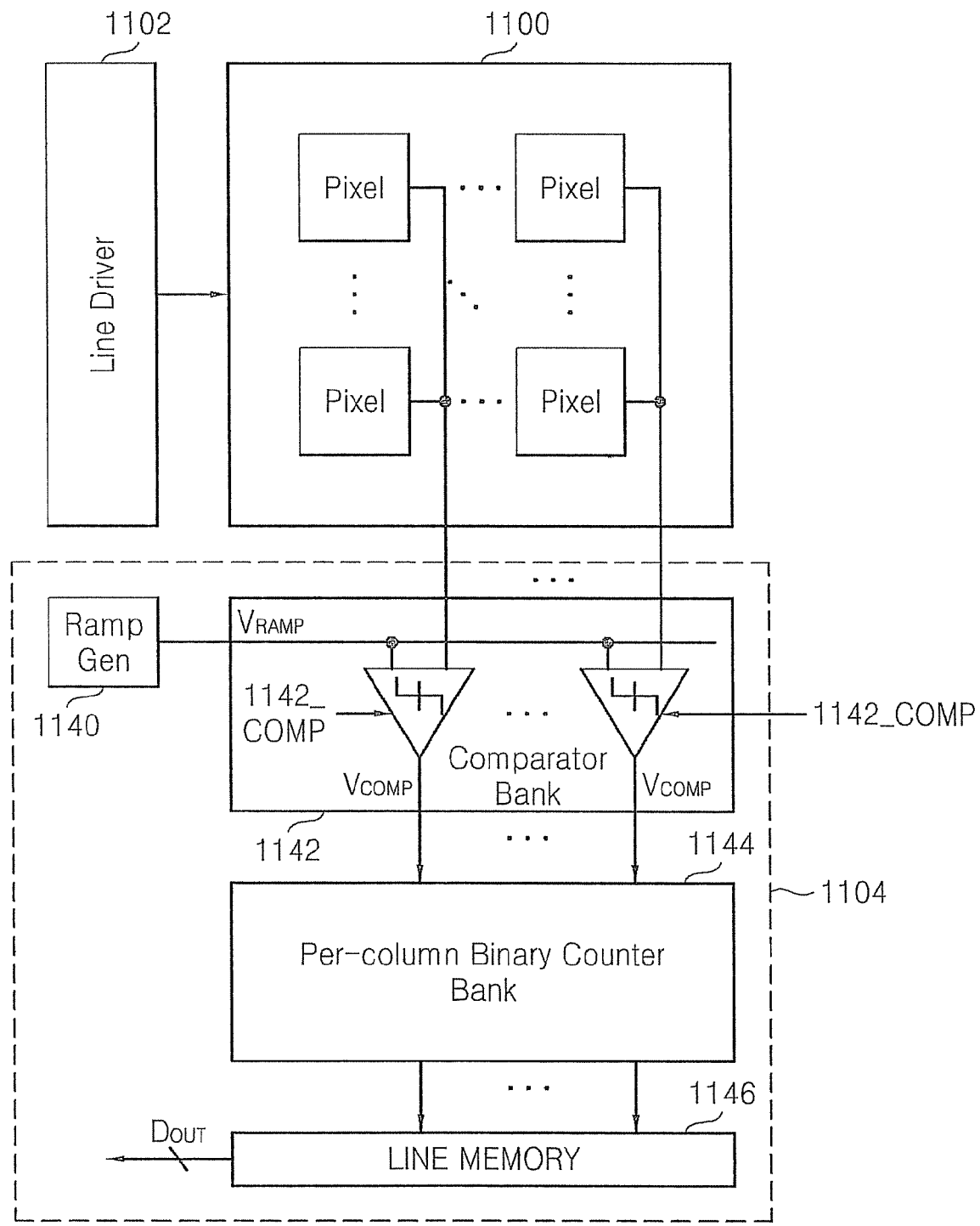
FIGS. 12A and 12B illustrate analog-to-digital converters.
Figure 12B:
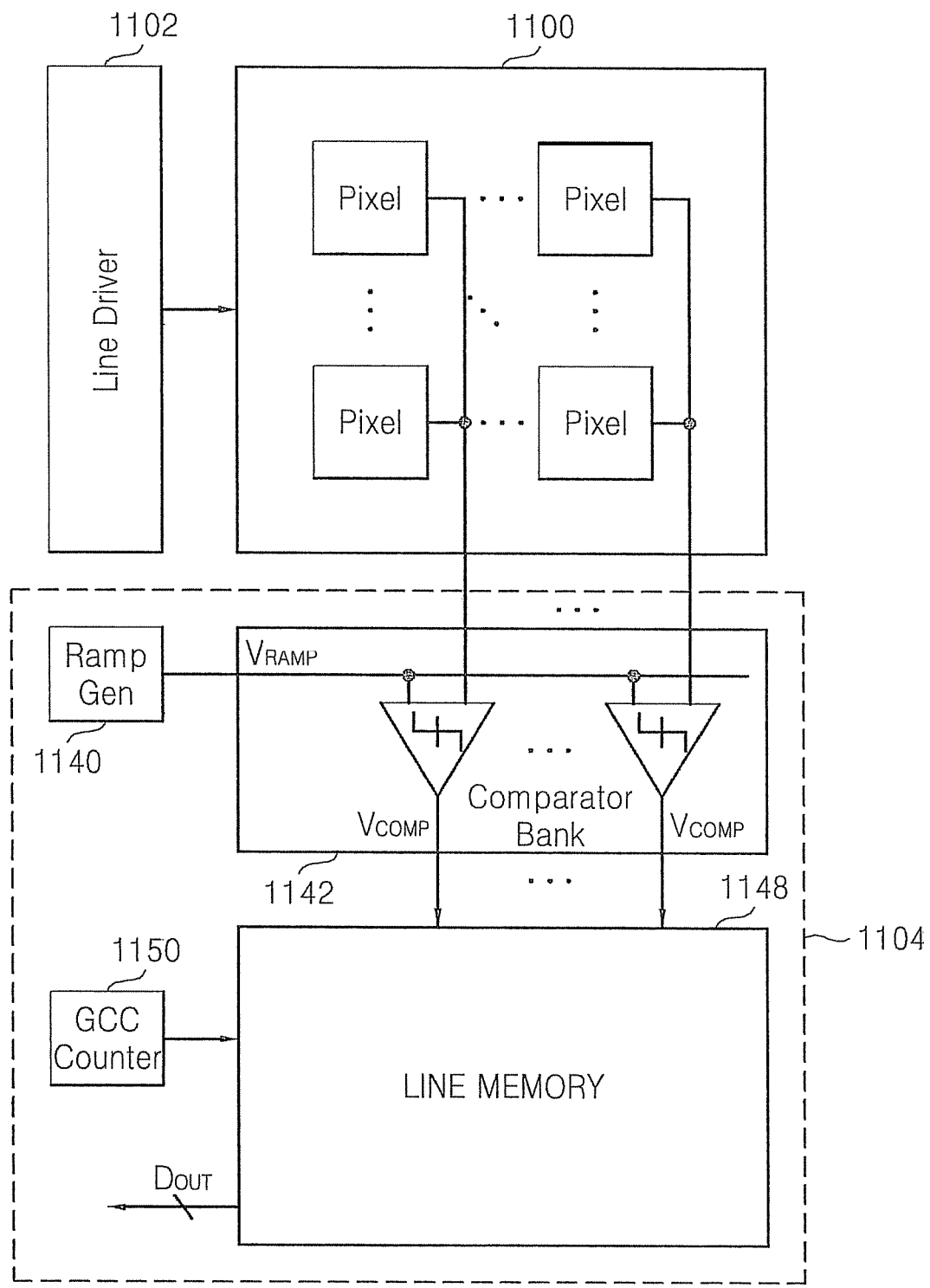

FIGS. 12A and 12B show example ADCs in more detail.

Referring to FIG. 12A, a ramp generator 1140 generates a reference voltage (or ramp signal) VRAMP and outputs the generated reference voltage VRAMP to the comparator bank 1142. The comparator bank 1142 compares the ramp signal VRAMP with each output from the pixel array 1100 to generate a plurality of comparison signals VCOMP.

In more detail, the comparator bank 1142 includes a plurality of comparators 1142_COMP. Each of the plurality of comparators 1142_COMP corresponds to a column of pixels P in the pixel array 1100. In example operation, each comparator 1142_COMP generates a comparison signal VCOMP by comparing the output of a corresponding pixel P to the ramp voltage VRAMP. The toggling time of the output of each comparator 1142_COMP is correlated to the pixel output voltage.

The comparator bank 1142 outputs the comparison signals VCOMP to a counter bank 1144, which converts the comparison signals VCOMP into digital output signals.

In more detail, the counter bank 1144 includes a counter for each column of the pixel array 1100, and each counter converts a corresponding comparison signal VCOMP into a digital output signal. A counter of the counter bank 1144 according to example embodiments will be discussed in more detail later. The counter bank 1044 outputs the digital output signals to a line memory 1146. The digital output signals for an ith row ROW_i of the pixel array is referred to as digital data.

The line memory 1146 stores the digital data from the counter bank 1144 while output voltages for a new row of pixels are converted into digital output signals.

Referring to FIG. 12B, in this example the comparator 1142 outputs the comparison signals VCOMP to the line memory 1148 as opposed to the binary counter bank 1144 shown in FIG. 12A. Otherwise, the ramp generator 1140 and the comparator bank 1142 are the same as the ramp generator 1140 and comparator bank 1142 described above with regard to FIG. 11.

A gray code counter (GCC) 1150 is coupled to the line memory 1148. In this example, the GCC 1150 generates a sequentially changing gray code. The GCC 1150 may receive an output from a frequency divider (not shown).

The line memory 1148 stores the sequentially changing gray code at a certain time point based on the comparison signals VCOMP received from the comparator bank 1142. The stored gray code represents the intensity of light received at the pixel or pixels.

Example embodiments are directed to a conversion of a frequency divider system. Example embodiments disclose converting a frequency divider by an even factor, into a frequency divider by either an odd or any integer factor (even and odd), thereby gaining more flexibility without significant power or area penalties. Frequency divider systems according to example embodiments conserve a 50% output duty cycle attribute of the original frequency divider. Moreover, frequency divider systems according to example embodiments conserve a maximum input clock frequency of the frequency divider.

Figure 3:
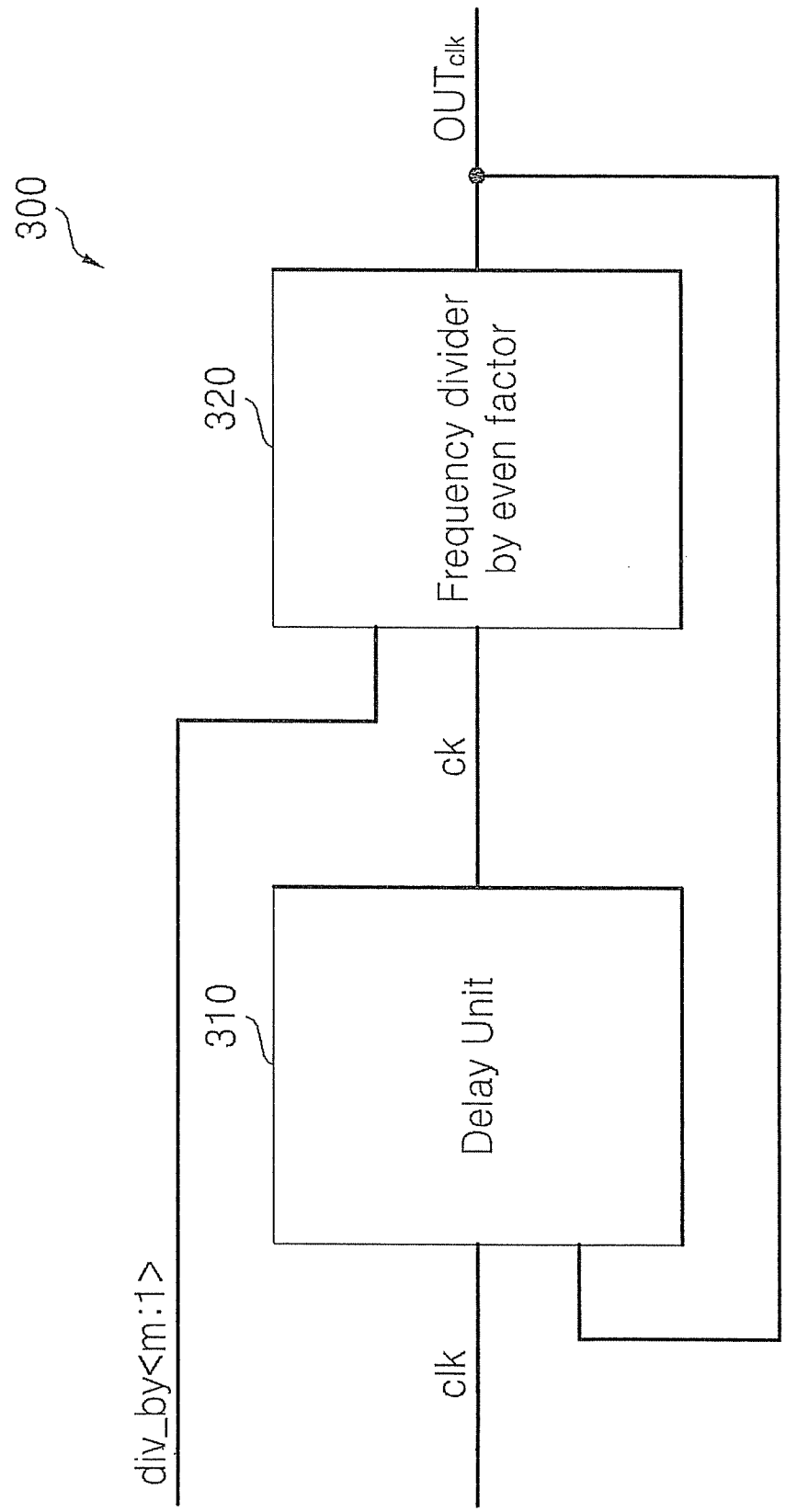

FIG. 3 illustrates a frequency divider (by an odd factor) system according to an example embodiment. A frequency divider system 300 includes a delay unit 310 and a frequency divider 320. The frequency divider 320 is a frequency divider by an even factor (e.g., 2*N, where N is an integer greater than or equal to one).

The delay unit 310 receives a first input clock signal clk and an output clock signal $OUT_{clk}$ output from the frequency divider 320. The first input clock signal clk has a first input clock frequency. Based on the first input clock signal clk and the output clock signal $OUT_{clk}$, the delay unit 310 outputs a modified clock signal ck. The delay unit 310 provides a half-period delay and may output a half-period delay between two sequential (consecutive) pulses of the modified clock signal ck when the output clock signal $OUT_{clk}$ changes from a low (e.g., first level) to high (e.g., second level) or visa versa.

The modified clock signal ck is output from the delay unit 310 and input to the frequency divider 320. In addition to the modified clock signal ck, the frequency divider 320 receives division factor control bits div_by<m:1>. As shown in FIG. 3, the frequency divider 320 receives the division factor control bits div_by<m:1> and the modified clock signal ck and outputs the output clock signal $OUT_{clk}$ based on the division factor control bits div_by<m:1> and the modified clock signal ck. The output clock signal $OUT_{clk}$ has an output clock frequency. The output clock frequency is an odd division of the first input clock frequency.

FIG. 4 illustrates a timing diagram of the frequency divider system 300. As shown in FIG. 4, the frequency divider system 300 is configured to use the frequency divider by an even factor 320 to output the output clock signal OUTclk having the output clock frequency that is an odd division of the first input clock frequency.

More specifically, FIG. 4 illustrates the first input clock signal clk, the modified clock signal ck and the output clock signal $OUT_{clk}$. FIG. 4 illustrates a frequency division by nine. At $T_0$-$T_k$, the delay unit 310 provides an additional half period delay D in the modified clock signal ck between two sequential modified clock pulses when the output clock signal $OUT_{clk}$ changes from a low level to a high level or vice versa. Thus, the delay becomes one period 2D. The delay unit 310 provides the additional half period delay D when the modified clock signal ck returns to low.

As a result, the division factor increases from 2*N to 2*N+1 and a 50% duty cycle of the output clock signal $OUT_{clk}$ is conserved. Moreover, the conversion from an even factor division to an odd factor division does not affect a maximum counting frequency of the frequency divider 320.

Figure 5A:
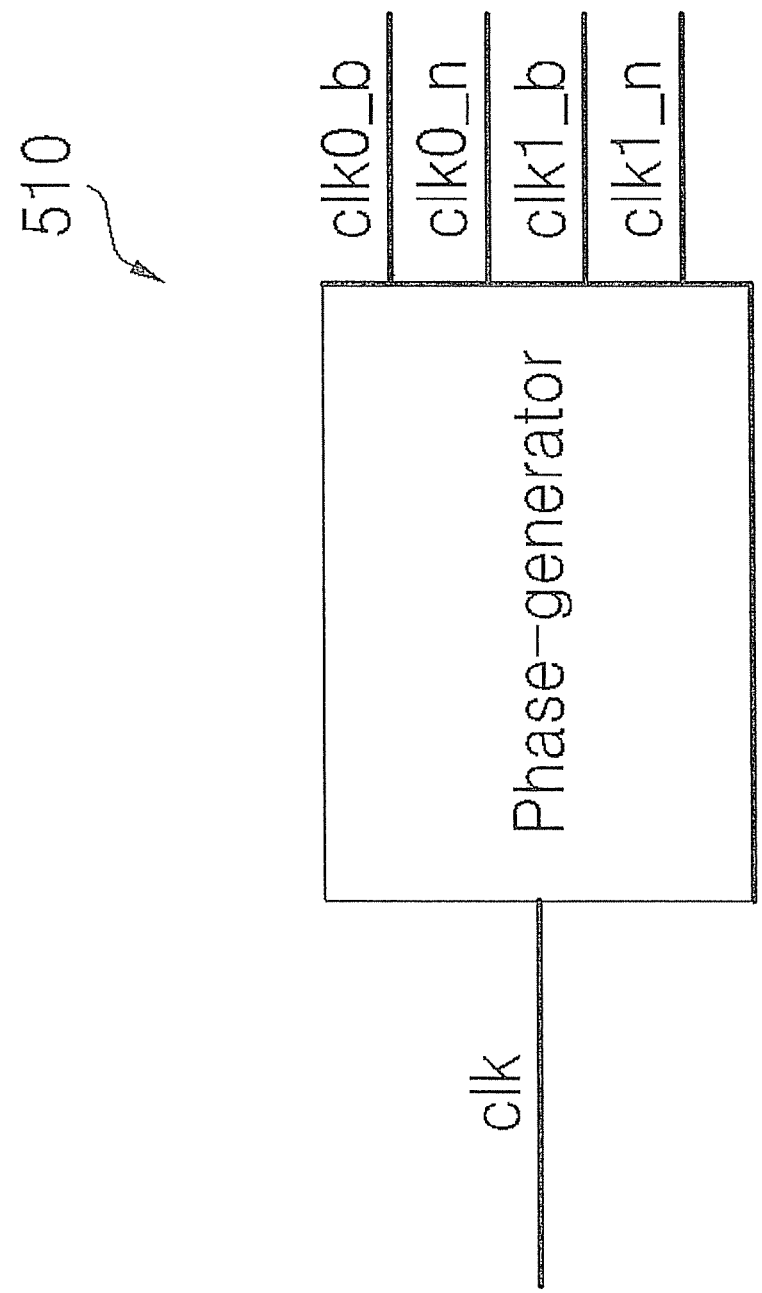
FIGS. 5A and 5B illustrate an example embodiment of a delay unit shown in FIG. 3.
Figure 5B:
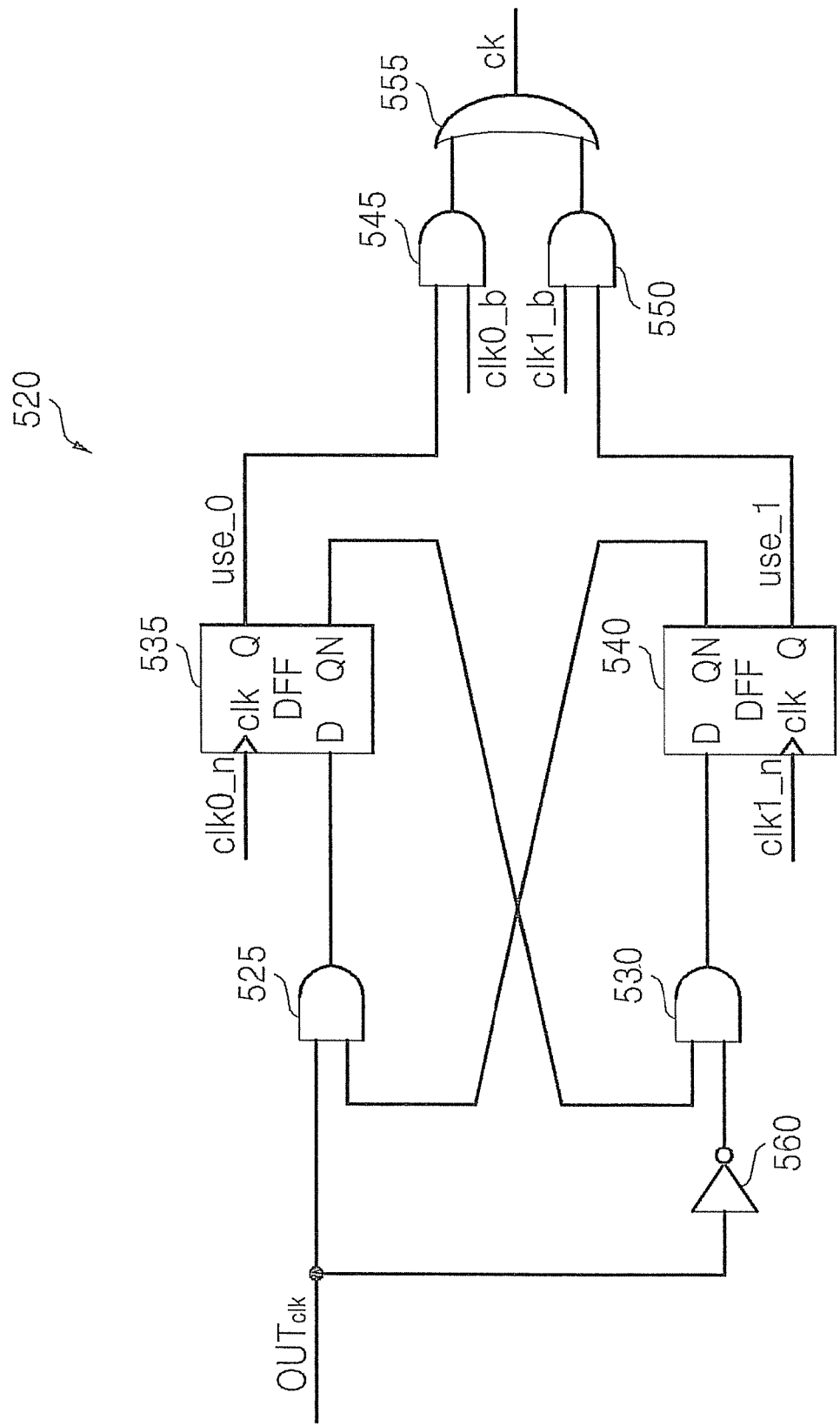

FIGS. 5A and 5B illustrate an example embodiment of the delay unit 310 that is shown in FIG. 3. The delay unit 310 includes a phase generator 510 and a delay system 520.

FIG. 5A illustrates an example embodiment of the phase generator 510. The phase generator 510 receives the first input clock signal clk and outputs intermediate clock signals clk0_b, clk0_n, clk 1_b and clk1_n. Generally, intermediate clock signals clk0_b and clk1_b are synchronous, but opposite in polarity. Generally, the intermediate clock signals clk0_n and clk1_n are synchronous, but opposite in polarity. The frequencies of the intermediate clock signals clk0_b, clk0_n, clk 1_b and clk1_n are equal to the first input clock signal clk.

As shown in FIG. 5B, the delay system 520 receives the output clock signal $OUT_{clk}$ and the intermediate clock signals clk0_b, clk0_n, clk 1_b and clk1_n. The delay system 520 includes first, second, third and fourth AND gates 525, 530, 545, 550, first and second flip-flops 535, 540, an OR gate 555 and an inverter 560.

The output clock signal $OUT_{clk}$ is output from the frequency divider 320 and input to the inverter 560 and the first AND gate 525 of the delay system 520 (which is included in the delay unit 310). The inverter 560 outputs an inverted output clock signal to the second AND gate 530. The second AND gate 530 also receives an inverted output of the first flip-flop 535. Based on the inverted output clock signal and the inverted output of the first-flop 535, the second AND gate 530 outputs an input to the second flip-flop 540.

The second flip-flop 540 receives the output from the second AND gate 530 as a data input and the intermediate clock signal clk1_n as a clock input. Based on the output of the second AND gate 530 and the intermediate clock signal clk1_n, the second flip-flop 540 outputs a second use signal use_1 as an output. An inverted output signal from the second flip-flop 540 is input to the first AND gate 525 and the second use signal use_1 is input to the fourth AND gate 550.

The first AND gate 525 receives the output clock signal $OUT_{clk}$ and the inverted output signal from the second flip-flop 540 as inputs. An output of the first AND gate 525 is based on the output clock signal $OUT_{clk}$ and the inverted output signal from the second flip-flop 540 and is a data input for the first flop-flop 535. In addition to receiving the output from the first AND gate 525, the first flip-flop 535 receives the intermediate clock signal clk0_n as a clock input. Based on the output from the first AND gate 525 and the intermediate clock signal clk0_n, the first flip-flop 535 outputs a first use signal use_0. The first flip-flop also outputs an inverted output signal which is input to the second AND gate 530.

The third AND gate 545 receives the first use signal use_0 and the intermediate clock signal clk0_b as inputs. Based on the first use signal use_0 and the intermediate clock signal clk0_b, the third AND gate 545 outputs an input to the OR gate 555.

The fourth AND gate 550 receives the second use signal use_1 and the intermediate clock signal clk1_b as inputs. Based on the second use signal use_1 and the intermediate clock signal clk1_b, the fourth AND gate 550 outputs an input to the OR gate 555.

The OR gate 555 receives the outputs of the third and fourth AND gates 545 and 550, and based on the outputs of the third and fourth AND gates 545 and 550, outputs the modified clock signal ck.

Figure 6:
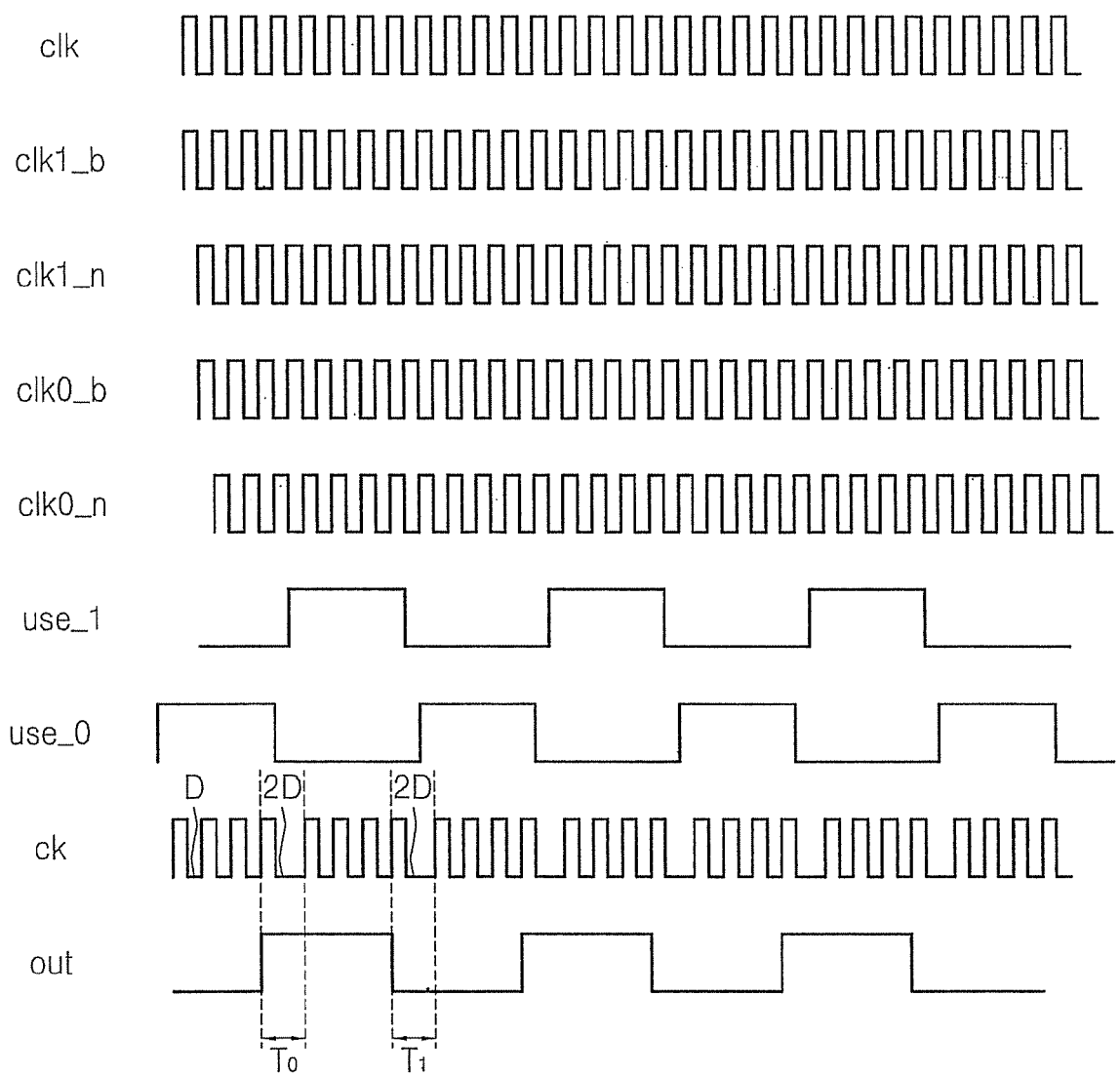

FIG. 6 illustrates a timing diagram of the phase generator 510 and the delay system 520. As shown, an additional half period delay D is inserted when the output clock signal $OUT_{clk}$ changes from a low level to a high level or vice versa. The additional half period delay D can be created by glitch free mixing between intermediate clock signals clk0_b and clk1_b based on the input clock signal clk. Small delays between the first and second use signals use_0 and use_1 change when both intermediate clock signals clk1_b and clk0_b are low, which ensures glitch free muxing between phases.

As described above, the frequency divider system 300 includes the delay unit 310 configured to receive the first input clock signal clk having the first input clock frequency and output the modified clock signal ck, and the frequency divider 320 configured to receive the modified clock signal ck and output the output clock signal $OUT_{clk}$ having the output clock frequency. The output clock frequency is an odd division of the first input clock frequency based on the modified clock signal.

Figure 7:
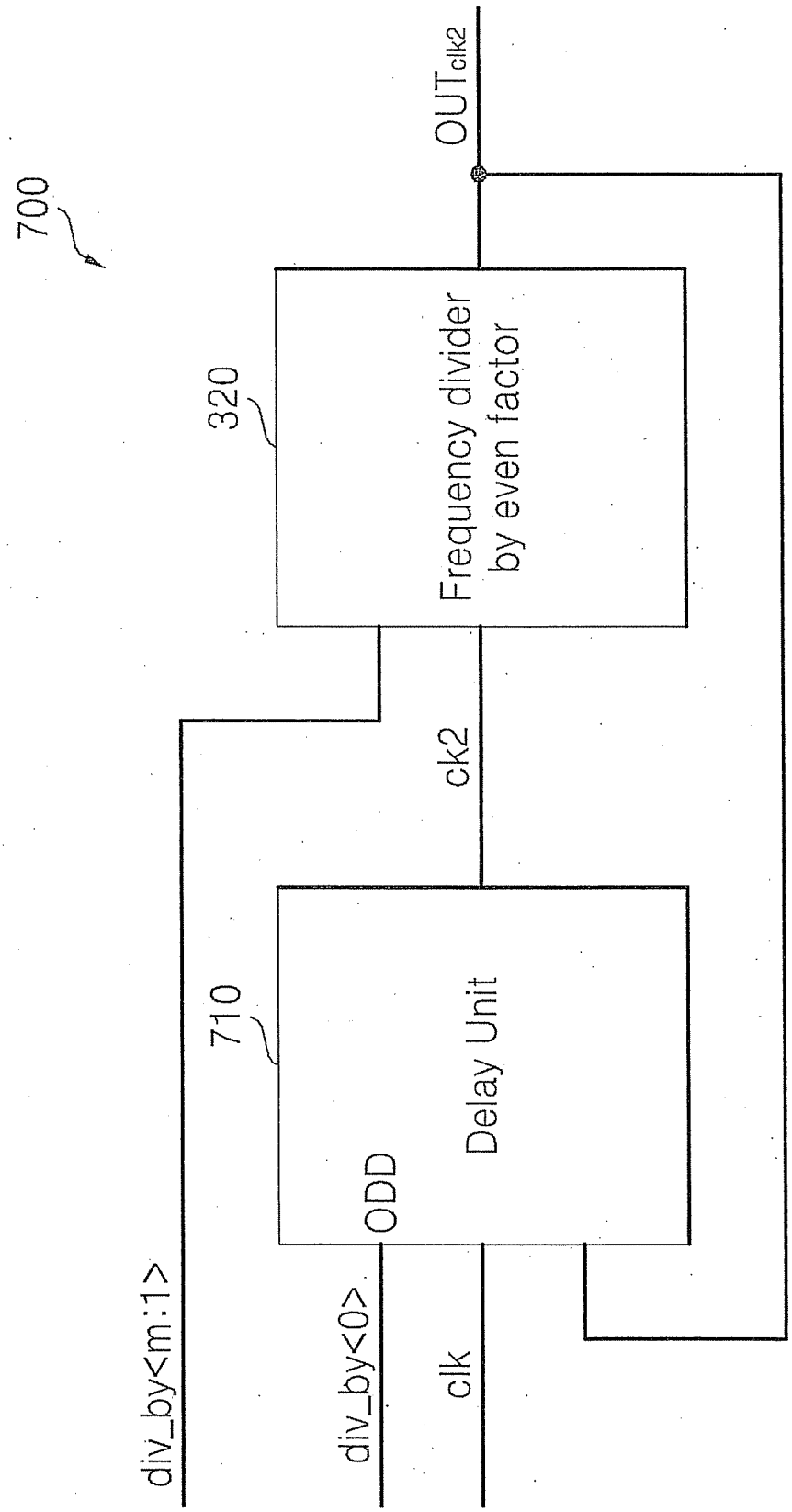

FIG. 7 a frequency divider system according to another example embodiment. As shown in FIG. 7, a frequency divider system 700 includes a delay unit 710 and the frequency divider 320. The frequency divider system 700 is the same as the frequency divider system 300 except that the delay unit 710 includes an additional odd control port ODD (as opposed to the delay unit 316). Since the delay unit 710 includes the odd control port ODD, the frequency divider system 700 may operate as a frequency divider by an even factor or an odd factor.

For example, the delay unit 710 is configured to receive a least significant bit (LSB) for a division factor control word div_by <0>. If the LSB div_by <0> is a low logic value, the function of skipping a half-period may be disabled and the delay unit 710 may copy the input clock signal clk. Thus, an output ck2 of the delay unit 710 is the input clock signal clk. Therefore, the frequency divider system 700 becomes a frequency divider by an even factor when the LSB div_by <0> is the low logic value.

Disabling the half-period skip may be implemented in various ways in the delay unit 710. For example, the delay unit 710 may have the circuit design of the delay unit 310 and additional logic that maintains the use signals use_1 and use_0 steady (e.g., use_0 is low and use_1 is high or vice versa) if the ODD control port input is low.

While the disablement of the skip half-period is described with the LSB div_by<0> being a low logic value, it should be understood the other example embodiments may be implemented by disabling the skip half-period using the LSB div_by<0> as a high logic value.

Based on the LSB div_by<0> and the first input clock signal clk, the delay unit 710 outputs the modified clock signal ck2. If the half-period skip is enabled, the modified clock signal ck2 is the same as the modified clock signal ck. The frequency divider 320 receives the division factor control bits div_by <m:1> and the modified clock signal ck2 and outputs an output clock signal $OUT_{clk2}$.

Figure 8:
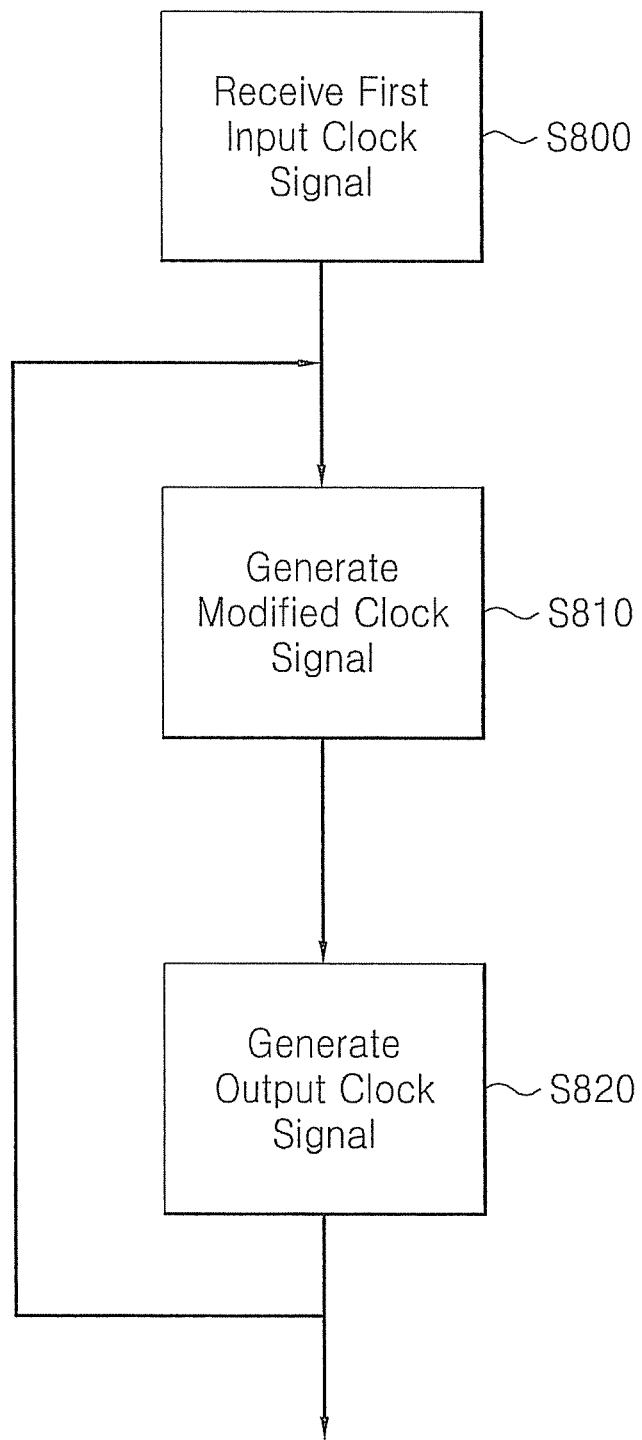

FIG. 8 illustrates a method of generating an output clock signal according to example embodiments. The method shown in FIG. 8 may be implemented by the frequency divider system 300 (shown in FIG. 3) and the frequency divider system 700 (shown in FIG. 7), and therefore, may include the functions that the frequency divider systems 300 and 700 are configured to pedal in.

At step S800, a delay unit (e.g., the delay unit 300) receives a first input clock signal. The delay unit generates a modified clock signal (e.g., the modified clock signal ck) based on the first input clock signal and an output clock signal (e.g., the output clock signal $OUT_{clk}$), at step S810. The modified clock signal includes a half-period delay if the output clock signal changes from a first state to a second state or from a second state to a first state.

If the delay unit is configured to receive a least significant bit (LSB) for a division factor control word (e.g., div_by <0> in the delay unit 700) and the LSB is a low logic value, the modified clock signal that is generated at S810 is the first input clock signal. Thus, if the LSB is a low logic value, the first input clock signal is not modified.

At step S820, a frequency divider (e.g., the frequency divider 320) receives the modified clock signal and generates the output clock signal. The output clock signal has a frequency that is an odd division of the first input clock frequency. If the frequency divider receives the first input clock signal as the modified clock signal (e.g., the LSB is a low logic value), the output clock signal has a frequency that is an even division of the first input clock frequency.

As described above, the frequency divider system (e.g., 300 or 700) is configured to implement a method including first generating a first input clock signal having a first input clock frequency, second generating a modified clock signal based on the first input clock signal, the modified clock signal having a delay between two consecutive pulses if the output clock signal changes from a first state to a second state or from the second state to the first state, and third generating the output clock signal having a frequency that is an odd division or an even division of the first input clock frequency.

Figure 9:
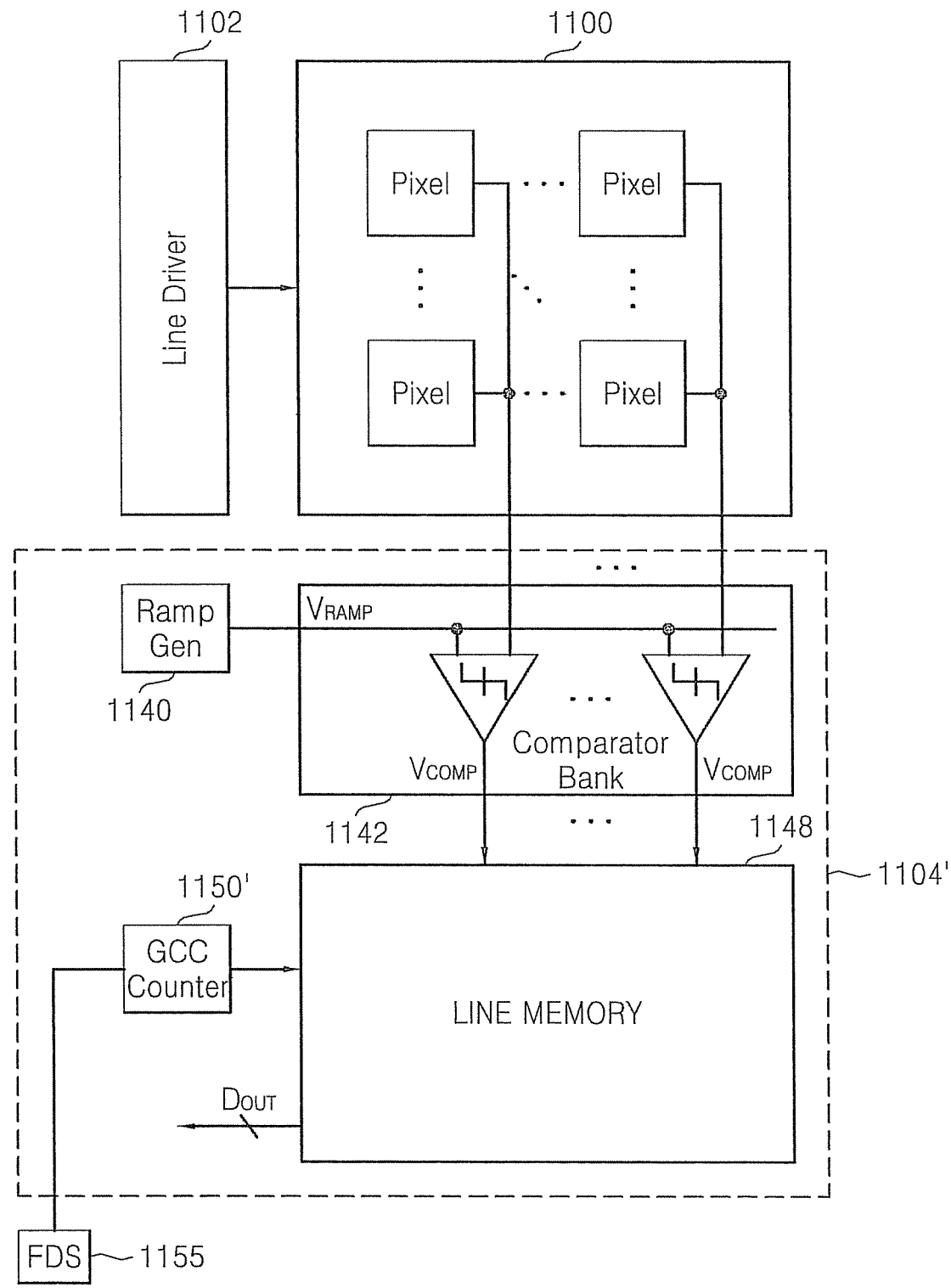

FIG. 9 illustrates an image sensor including a frequency divider system according to example embodiments. The image sensor of FIG. 9 is the same as the image sensor shown in FIG. 12B except for differences between the ADC 1104 and an ADC 1104' that is shown in FIG. 9. As shown in FIG. 9, a frequency divider system (FDS) 1155 provides an input to the GCC counter 1150'. The GCC counter 1150' generates a sequentially changing gray code based on the output from the FDS 1155. The FDS 1155 may include the frequency divider 300 or the frequency divider 700.

Figure 10:
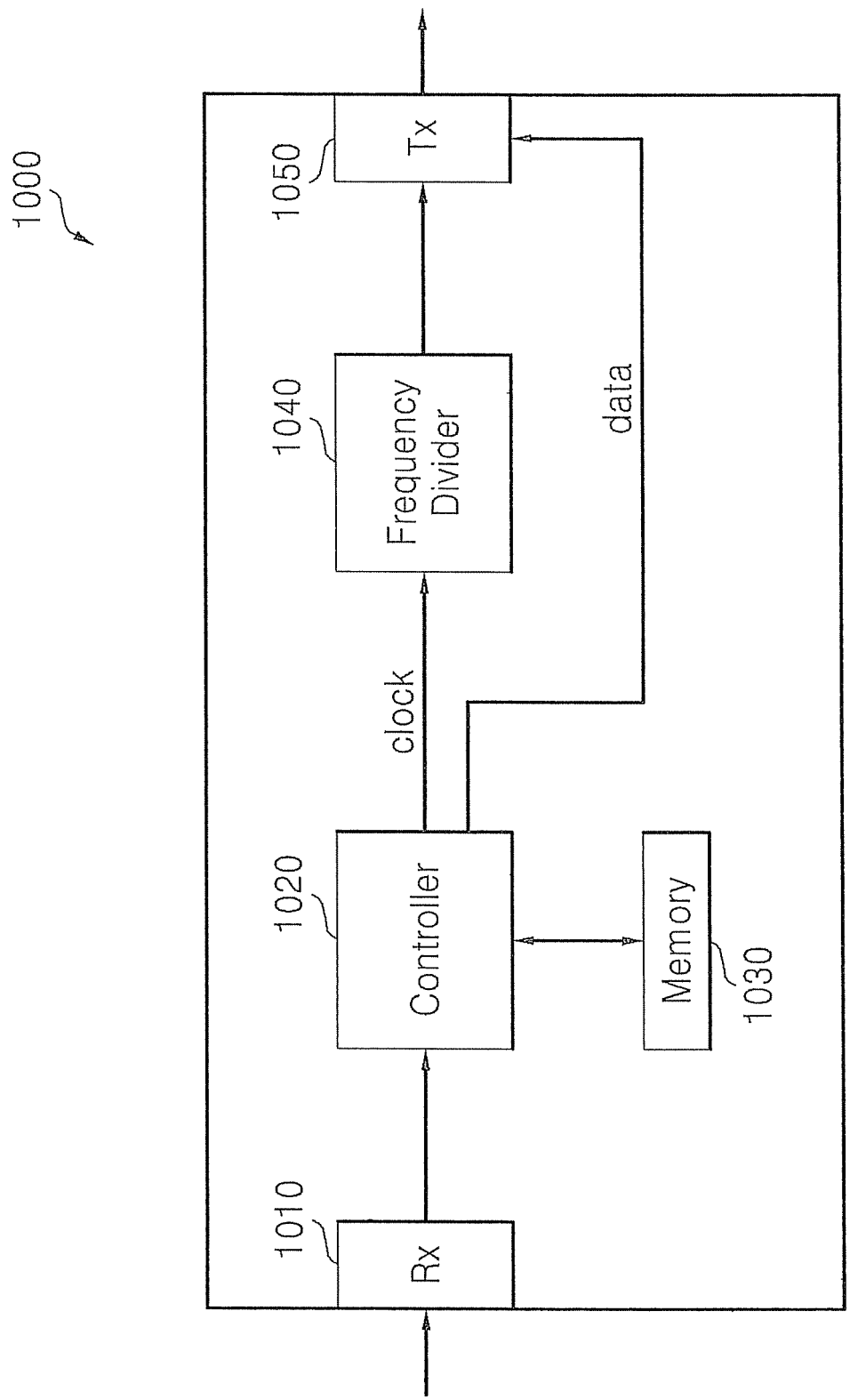

FIG. 10 illustrates a system including a frequency divider according to example embodiments. As shown, a system 1000 includes a receiver 1010, a controller 1020, a memory 1030, a frequency divider 1040 and a transmitter 1050. The controller 1020 is configured to receive data from the receiver 1010 and store the data in the memory 1030. The controller 1020 may be a microprocessor, for example.

The controller 1040 is also configured to send clock signals to the frequency divider 1040. The frequency divider 1040 may be the frequency divider 300 or the frequency divider 700. The frequency divider 1040 divides the clock from the controller 1020 and inputs a divided clock to the transmitter 1050. Based on the divided clock, the transmitter 1050 transmits data received from the controller 1020.

It should be understood that FIG. 10 illustrates some features for description of the system 1000. However, it should be understood that the system 1000 may include more features than the features illustrated in FIG. 10.

Figure 13:
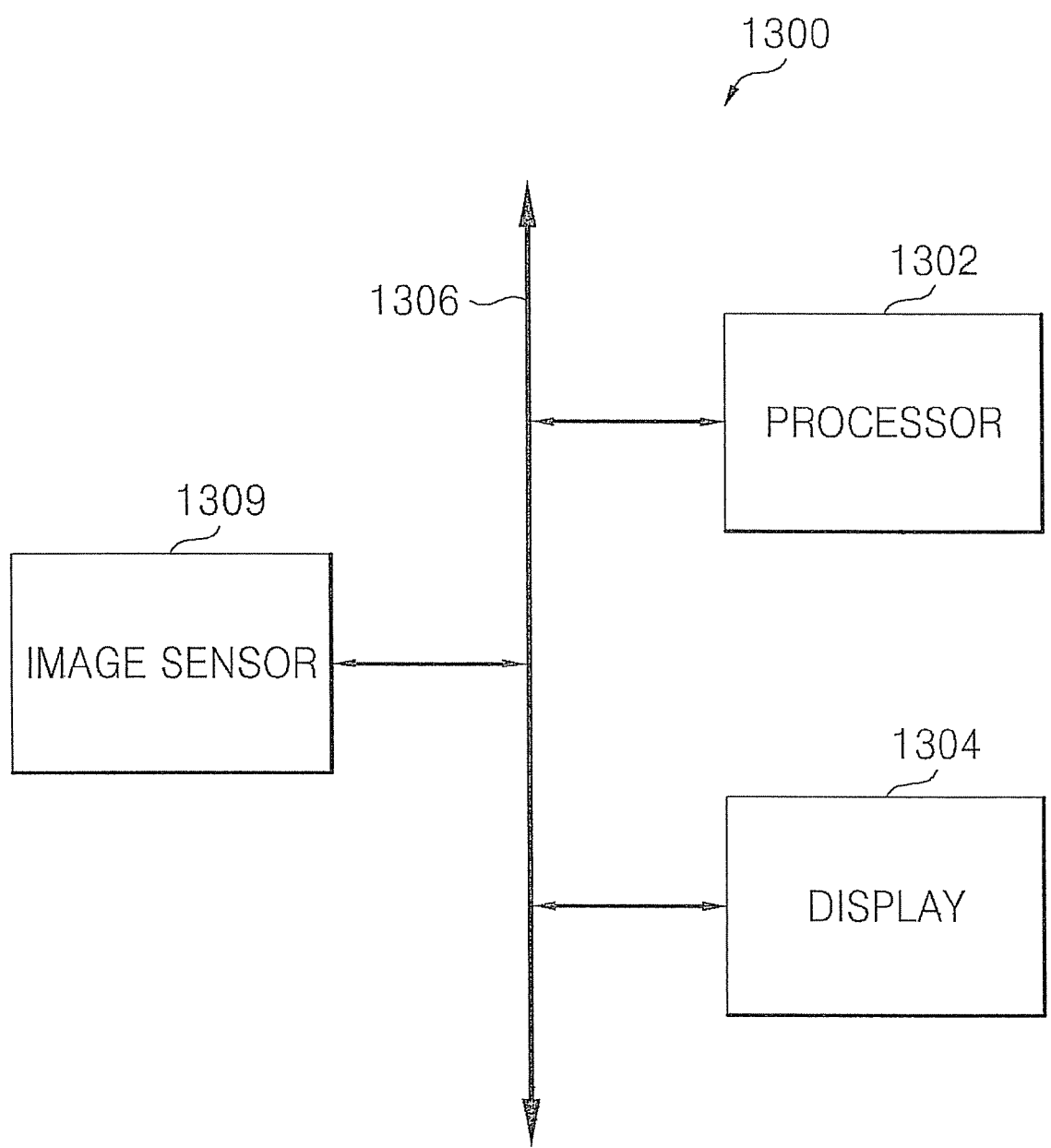

FIG. 13 is a block diagram illustrating an electronic system according to an example embodiment.

Referring to FIG. 13, a system 1300 includes a processor 1302, an image sensor 1301, and a display 1304 that communicate with each other via a bus 1306. The processor 1302 is configured to execute a program and control the electronic system. The image sensor 1300 is configured to capture image data by converting optical images into electrical signals. The image sensor 1300 may be an image sensor as described above with regard to FIG. 9. The processor 1302 may include the image signal processor 1108 shown in FIG. 11, and may be configured to process the captured image data for storage in a memory (not shown) and/or display by the display 1304. The electronic system may be connected to an external device (e.g., a personal computer or a network) through an input/output device (not shown) and may exchange data with the external device.

The systems 1000 and 1300 may be apparatuses configured to receive and transmit data such as a computer, a user equipment (UE) or a base station. For example, the electronic system shown in FIGS. 10 and 13 may embody various electronic control systems including an image sensor (e.g., a digital camera), and may be used in, for example, mobile phones, personal digital assistants (PDAs), laptop computers, netbooks, MP3 players, navigation devices, household appliances, or any other device utilizing an image sensor or similar device.

As used herein, the term "user equipment" (UE) may be synonymous to a mobile user, mobile station, mobile terminal, user, subscriber, wireless terminal and/or remote station and may describe a remote user of wireless resources in a wireless communication network.

Example embodiments being thus described, it will be obvious that the same may be varied in many ways. For example, frequency divider systems according to example embodiments may be implemented in devices other than those illustrated. Such variations are not to be regarded as a departure from the spirit and scope of example embodiments, and all such modifications as would be obvious to one skilled in the art are intended to be included within the scope of the claims.

What is claimed is:

1. A frequency divider system comprising:
   a delay unit configured to receive a first input clock signal having a first input clock frequency and output a modified clock signal; and
   a frequency divider configured to receive the modified clock signal and output an output clock signal having an output clock frequency, the output clock frequency being an odd division of the first input clock frequency based on the modified clock signal, wherein
   the delay unit includes,
      a phase generator configured to receive the first clock signal and output at least one intermediate clock signal having a same or a different phase than the first clock signal, and
      a delay system configured to receive the at least one intermediate clock signal and output the modified clock signal based on the at least one intermediate clock signal, the delay system is configured to receive the output clock signal and the delay system includes,
      a first AND gate configured to receive the output clock signal and a first output of a first flip-flop and output a first flip-flop input signal based on the output clock signal and the first output of the first flip-flop,
      a second AND gate configured to receive an inverted output clock signal and a first output of a second flip-flop and output a second flip-flop input signal based on the inverted output clock signal and the first output of the second flip-flop,
      the first flip-flop configured to receive the first flip-flop input signal and a first signal of the at least one intermediate clock signal and output a first use signal based on the first flip-flop input signal and the first signal of the at least one intermediate clock signal,
      the second flip-flop configured to receive the second flip-flop input signal and a second signal of the at least one intermediate clock signal and output a second use signal based on the second flip-flop input signal and the second signal of the at least one intermediate clock signal,
      a third AND gate configured to receive the first use signal and a third signal of the at least one intermediate clock signal and output a first input to an OR gate based on the first use signal and the third signal of the at least one intermediate clock signal,
      a fourth AND gate configured to receive the second use signal and a fourth signal of the at least one intermediate clock signal and output a second input to the OR gate based on the second use signal and the fourth signal of the at least one intermediate clock signal, and
      the OR gate configured to output the modified clock signal based on the first and second inputs to the OR gate.

2. The frequency divider system of claim 1, wherein the first and third signals of the at least one intermediate clock signal are out of phase by 180° with respect to each other.

3. The frequency divider system of claim 1, wherein the second and fourth signals of the at least one intermediate clock signal are out of phase by 180° with respect to each other.

4. A frequency divider system comprising:
   a delay unit configured to receive a first input clock signal having a first input clock frequency and output a modified clock signal; and
   a frequency divider configured to receive the modified clock signal and output an output clock signal having an output clock frequency, the output clock frequency being an odd division or an even division of the first input clock frequency based on the modified clock signal, wherein the delay system includes,
   a first AND gate configured to receive the output clock signal and a first output of a first flip-flop and output a first flip-flop input signal based on the output clock signal and the first output of the first flip-flop,
   a second AND gate configured to receive an inverted output clock signal and a first output of a second flip-flop and output a second flip-flop input signal based on the inverted output clock signal and the first output of the second flip-flop,
   the first flip-flop configured to receive the first flip-flop input signal and a first signal of the at least one intermediate clock signal and output a first use signal based on the first flip-flop input signal and the first signal of the at least one intermediate clock signal,
   the second flip-flop configured to receive the second flip-flop input signal and a second signal of the at least one intermediate clock signal and output a second use signal based on the second flip-flop input signal and the second signal of the at least one intermediate clock signal,
   a third AND gate configured to receive the first use signal and a third signal of the at least one intermediate clock signal and output a first input to an OR gate based on the first use signal and the third signal of the at least one intermediate clock signal,
   a fourth AND gate configured to receive the second use signal and a fourth signal of the at least one intermediate clock signal and output a second input to the OR gate based on the second use signal and the fourth signal of the at least one intermediate clock signal, and
   the OR gate configured to output the modified clock signal based on the first and second inputs to the OR gate.

* * * * *